(12) United States Patent
Ma et al.

(10) Patent No.: US 11,730,047 B1
(45) Date of Patent: Aug. 15, 2023

(54) PEROVSKITE BASED CHARGE TRANSPORT LAYERS FOR THIN FILM OPTOELECTRONIC DEVICES AND METHODS OF MAKING

(71) Applicant: The Florida State University Research Foundation, Inc., Tallahassee, FL (US)

(72) Inventors: Biwu Ma, Tallahassee, FL (US); Yu Tian, Tallahassee, FL (US)

(73) Assignee: The Florida State University Research Foundation, Inc., Tallahassee, FL (US)

(*) Notice: Subject to any disclaimer, the term of this patent is extended or adjusted under 35 U.S.C. 154(b) by 0 days.

(21) Appl. No.: 17/478,365

(22) Filed: Sep. 17, 2021

Related U.S. Application Data

(62) Division of application No. 15/167,392, filed on May 27, 2016, now abandoned.

(51) Int. Cl.
*H10K 30/10* (2023.01)
*H10K 50/11* (2023.01)
(Continued)

(52) U.S. Cl.
CPC .............. *H10K 71/00* (2023.02); *H10K 30/10* (2023.02); *H10K 50/11* (2023.02); *H10K 50/15* (2023.02);
(Continued)

(58) Field of Classification Search
CPC .............. H01L 51/0002; H01L 51/0003; H01L 51/0026; H01L 51/0032; H01L 51/424; H01L 51/441; H01L 51/447; H10K 71/00; H10K 71/12; H10K 71/441; H10K 30/10; H10K 50/11; H10K 50/15; H10K 50/16;
(Continued)

(56) References Cited

U.S. PATENT DOCUMENTS 10,141,117 B2 * 11/2018 Vak .................... H01L 51/0004
2015/0340632 A1   11/2015 Etgar
(Continued)

FOREIGN PATENT DOCUMENTS

| WO | 2014202965 A1 | 12/2014 |
| WO | 2015139082 A1 | 9/2015 |
| WO | 2016072809 A1 | 5/2016 |

OTHER PUBLICATIONS

Park, Byung-Wook et al. "Chemical engineering of methylammonium lead iodide/bromide perovskites: tuning of optoelectronic properties and photovoltaic performance", J. Mater. Chem. A, 2015, 3, 21760.
(Continued)

Primary Examiner — Mayla Gonzalez Ramos
(74) Attorney, Agent, or Firm — Eversheds Sutherland (US) LLP

(57) ABSTRACT

A new type of charge transport layer based on organometal halide perovskite for highly efficient organic light emitting diodes (OLEDs) is demonstrated. By solution processing of halide perovskite precursors, smooth essentially pure perovskite thin films may be prepared with high transparency and conductivity. Solution processed multilayer OLED with this perovskite-based hole transport layer outperforms a device with a PEDOT:PSS layer.

20 Claims, 19 Drawing Sheets

(51) Int. Cl.
  *H10K 50/15* (2023.01)
  *H10K 50/16* (2023.01)
  *H10K 85/60* (2023.01)
  *H10K 85/10* (2023.01)
  *H10K 85/30* (2023.01)
  *H10K 71/00* (2023.01)
  *H10K 71/40* (2023.01)
  *H10K 101/10* (2023.01)
  *H10K 71/12* (2023.01)

(52) U.S. Cl.
  CPC .......... *H10K 50/16* (2023.02); *H10K 71/441* (2023.02); *H10K 85/60* (2023.02); *H10K 71/12* (2023.02); *H10K 85/1135* (2023.02); *H10K 85/146* (2023.02); *H10K 85/342* (2023.02); *H10K 2101/10* (2023.02)

(58) Field of Classification Search
  CPC .... H10K 85/60; H10K 85/146; H10K 85/342; H10K 85/1135
  See application file for complete search history.

(56) References Cited

U.S. PATENT DOCUMENTS

| 2016/0035496 | A1* | 2/2016 | Irwin .................. H01L 51/422 |
| | | | 136/265 |
| 2016/0141535 | A1 | 5/2016 | Snaith et al. |
| 2017/0084399 | A1 | 3/2017 | Vak |
| 2017/0084400 | A1 | 3/2017 | Cheng et al. |
| 2017/0243699 | A1* | 8/2017 | Beaumont ............ H01L 31/032 |
| 2017/0358759 | A1 | 12/2017 | Lee et al. |

OTHER PUBLICATIONS

PCT International Search Report and Written Opinion for PCT Application No. PCT/US2017/034657 dated Aug. 16, 2017 (13 pages).

Liu et al., "Improved Crystallization of Perovskite Films by Optimized Solvent Annealing for High Efficiency Solar Cell," Applied Materials and Interfaces, 2015, 24008-24015.

Xiao et al., "Solvent Annealing of Perovskite-Induced Crystal Growth for Photovoltaic-Device Efficiency Enhancement," Adv. Mater., 2014, 26:6503-6509.

* cited by examiner

PEROVSKITE BASED CHARGE TRANSPORT LAYERS FOR THIN FILM OPTOELECTRONIC DEVICES AND METHODS OF MAKING

CROSS-REFERENCE TO RELATED APPLICATIONS

This application is a division of U.S. Patent application Ser. No. 15/167,392, filed May 27, 2016, which is incorporated herein by reference.

BACKGROUND OF THE INVENTION

1. Field of the Invention

This invention relates, generally, to thin film optoelectronic devices. More specifically, it relates to charge transport layers based on halide perovskite materials.

2. Brief Description of the Prior Art

Thin film optoelectronic devices have experienced tremendous development over the last decades. Light emitting diodes (LEDs) based on organics, polymers, and quantum dots have achieved high efficiencies and long lifetimes suitable for applications in full color displays and solid-state lighting. Organic/polymeric photovoltaic cells (PVs) have been established as a highly promising low-cost solar energy conversion technology with power conversion efficiencies improved from about 1% to more than 10%. All these thin film optoelectronic devices are configured in a typical layered structure, with the photoactive (either light emitting or light harvesting) layer sandwiched between charge transport layers in contact with two electrodes. The charge transport layers, i.e. hole transport layer (HTL) and electron transport layer (ETL), play critical roles in determining the device performance.

To overcome complicated synthesis and purification, low stability and conductivity, and high cost associated with known solution processed charge transport layers based on organic molecules, polymers, and metal oxides, it is desirable to start with abundant common materials and use a process in which thin films can be prepared by high throughput solution processing with high conductivity to significantly improve device performance. However, no such processes have yet been satisfactorily demonstrated.

Accordingly, what is needed is a solution based process to produce charge transport layers using common materials, resulting in high conductivity thin films. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

The present disclosure may address one or more of the problems and deficiencies of the prior art discussed above. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

Various embodiments may comprise a method for forming a charge transport layer of a thin film optoelectronic device. An organometal halide perovskite precursor may be formed. A substrate may be coated with the organometal halide perovskite precursor to form an organometal halide perovskite layer. The organometal halide perovskite layer may be passivated with a solvent during the coating step, and the passivated organometal halide perovskite layer may be annealed.

Additional embodiments may comprise a method for forming a charge transport layer of a thin film optoelectronic device. An organometal halide perovskite precursor may be formed by dissolving methylammonium chloride ($CH_3NH_3Cl$) and lead chloride ($PbCl_2$) in a mixture of dimethylformamide and dimethylsulfoxide. A substrate may be coated with the organometal halide perovskite precursor to form a layer of methylammonium lead chloride ($CH_3NH_3PbCl_3$) on the substrate. The methylammonium lead chloride layer may be passivated by adding a low polarity organic solvent during the coating step, and the passivated methylammonium lead chloride layer may be annealed.

Still further embodiments may comprise an optoelectronic device. The optoelectronic device may comprise a first charge transport layer, a photoactive layer, and a second charge transport layer. One or both of the first and second charge transport layers may comprise methylammonium lead chloride ($CH_3NH_3PbCl_3$) deposited from a mixture of methylammonium chloride ($CH_3NH_3Cl$) and lead chloride ($PbCl_2$) in a solution of dimethylformamide and dimethylsulfoxide, passivated with a low polarity organic solvent, and thermally annealed.

The long-standing but heretofore unfulfilled need for a solution based process to produce charge transport layers using common materials, resulting in highly conductive thin films is now met by a new, useful, and nonobvious invention.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
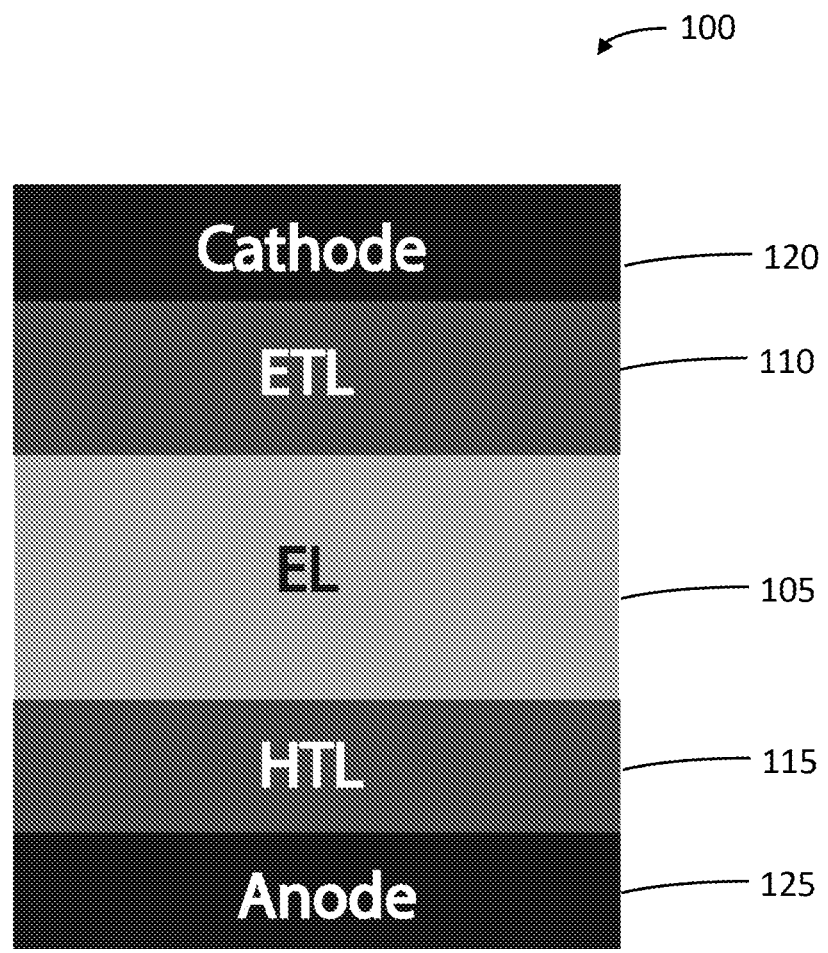
FIG. 1 is a schematic diagram of a typical multilayer thin film LED device structure.

In the following detailed description of the preferred embodiments, reference is made to the accompanying drawings, which form a part thereof, and within which are shown by way of illustration specific embodiments by which the present disclosure may be practiced. It is to be understood that other embodiments may be utilized and structural changes may be made without departing from the scope of the invention.

Typical thin film optoelectronic devices, such as light-emitting diodes (LEDs) and photovoltaic cells (PVs), may be configured with a layered structure, with a photoactive (either light emitting or light harvesting) layer sandwiched between charge transport layers that contact two electrodes. The charge transport layers, including hole transporting layer (HTL) and electron transporting layer (ETL), may play a critical role in determining the device performance. Materials to produce charge transport layers may comprise organics, polymers, and metal oxides.

The present disclosure may comprise a new type of charge transport layer based on halide perovskite thin films and methods for producing these thin films. The charge transport layer may comprise either a HTL or a ETL, or both in the same device, and may be used in different types of LEDs (such as organic, quantum dot, and perovskite emitting layers). Smooth halide perovskite thin films (with a thickness ranging from a few nanometers to a few hundred nanometers) may be prepared via either vacuum processing or facile solution processing, such as spin coat and ink-jet. The halide perovskite materials may have a general chemical formula of $ABX_3$, where A may be a cation such as but not limited to methylammonium ($CH_3NH_3$), formamidinium ($NH_2CHNH_2$), and cesium (Cs); B is a metal such as but not limited to lead (Pb), tin (Sn), and germanium (Ge); and X is a halide ion such as fluoride ($F^-$), chloride ($Cl^-$), bromide ($Br^-$), iodide ($I^-$) and astatide ($At^-$), and mixtures of these materials. Thin film optoelectronic devices, for example organic LEDs and organic PVs, may comprise perovskite-based charge transport layers that exhibit superior device performance over equivalent devices based on conventional charge transport layers such as poly(3,4-ethylenedioxythiophene): poly(styrenesulfonate)(PEDOT:PSS).

A desired hole transport material should have suitable energy levels and band gap, as well as high hole conductivity, for efficient hole injection and transport, and electron and exciton blocking mobility. A desired electron transport material should have suitable energy levels and band gap, as well as high electron conductivity, for efficient electron injection and transport, and hole and exciton blocking. Selection of the hole transport material and the electron transport material may comprise matching appropriate individual energy levels and band gaps of each of the materials in order to produce a desire functionality of the resulting optoelectronic device.

As far as fabrication methods for HTL and ETL are concerned, solution processing represents an attractive and economical approach to replace high vacuum processing for the production of thin films. Among a variety of solution processable hole transport materials developed to date, including organic molecules, polymers, and metal oxides, poly(3,4-ethylenedioxythiophene):poly(styrenesulfonate) (PEDOT:PSS) might be the most recognized material with good conductivity, high transparency, and suitable work function. However, there are many intrinsic limitations associated with PEDOT:PSS, such as its acidity and hygroscopic nature that lead to issues of device stability and degradation, and its lowest unoccupied molecular orbital (LUMO) energy level and band gap that result in weak electron blocking and serious exciton quenching. Crosslinkable organic/polymeric hole transport materials, which may allow for the formation of a solvent-resistant layer via crosslinking after solution processing, have been explored for multilayer structured devices, in particular organic light-emitting diodes (OLEDs). However, preparation of cross-linkable materials is not straightforward, which often involves costly multiple steps of syntheses and purifications. Transition metal oxides, such as oxides of nickel ($NiO_x$), molybdenum ($MoO_x$), tungsten ($WO_x$), and vanadium ($VO_x$), represent another class of hole transport materials that have been pursued. Solution processed metal oxide HTLs are mainly obtained by either thermal decomposition of organic-inorganic hybrid precursors or annealing of nanoparticles capped with organic solubilizing/stabilizing groups. Critical issues for solution processed oxide thin films include defect states due to stoichiometry deviations, residual—OH groups, and organic residues, which could negatively impact the device efficiency and stability.

Earth-abundant organometal halide perovskites have shown exceptional properties that make them suitable for low-cost high-performance optoelectronic devices. These properties mainly include facile low-temperature synthesis and solution processability, highly tunable direct band gaps across the visible to infrared regions, and high charge carrier mobilities. Perovskite-based PVs have been developed with device efficiencies increasing from about 3% to about 20%. Electrically driven LEDs and optically pumped lasers have also been demonstrated with these organic-inorganic hybrid semiconductors. The tunable band gaps, band positions, and high charge carrier mobilities of these materials also suggest that they could serve as high performance solution processable charge transport materials.

Figure 2A:
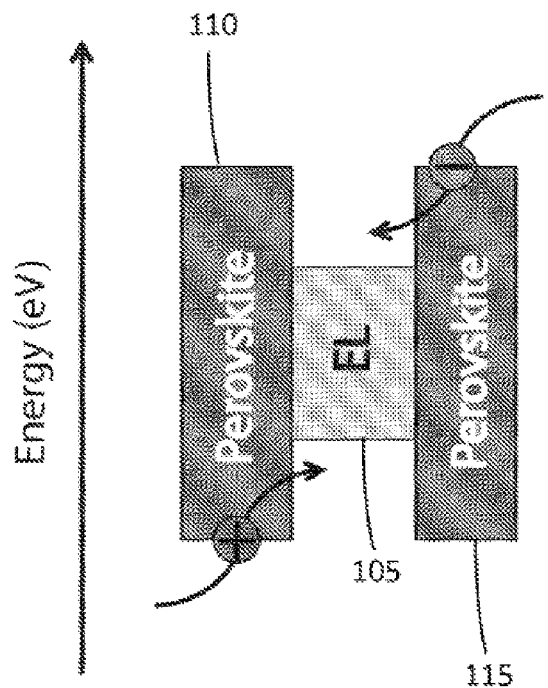
FIG. 2A is a schematic diagram of a portion of thin film LED device structure with perovskite ETL and HTL layers.
Figure 2B:
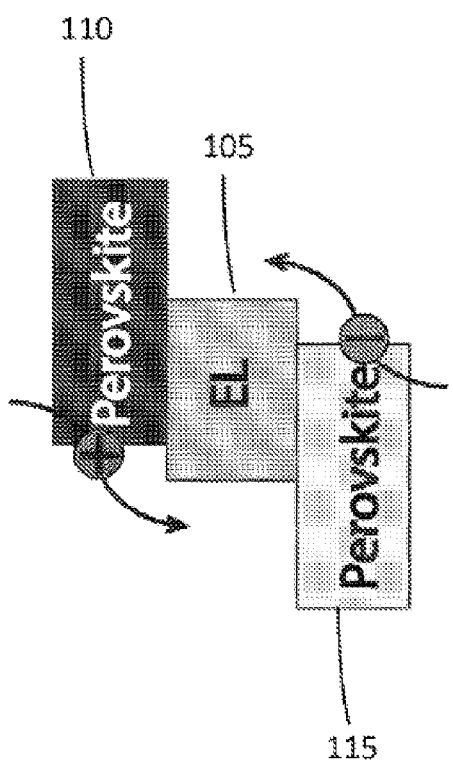
FIG. 2B is a schematic diagram of a portion of thin film LED device structure with perovskite ETL and HTL layers.
Figure 3:
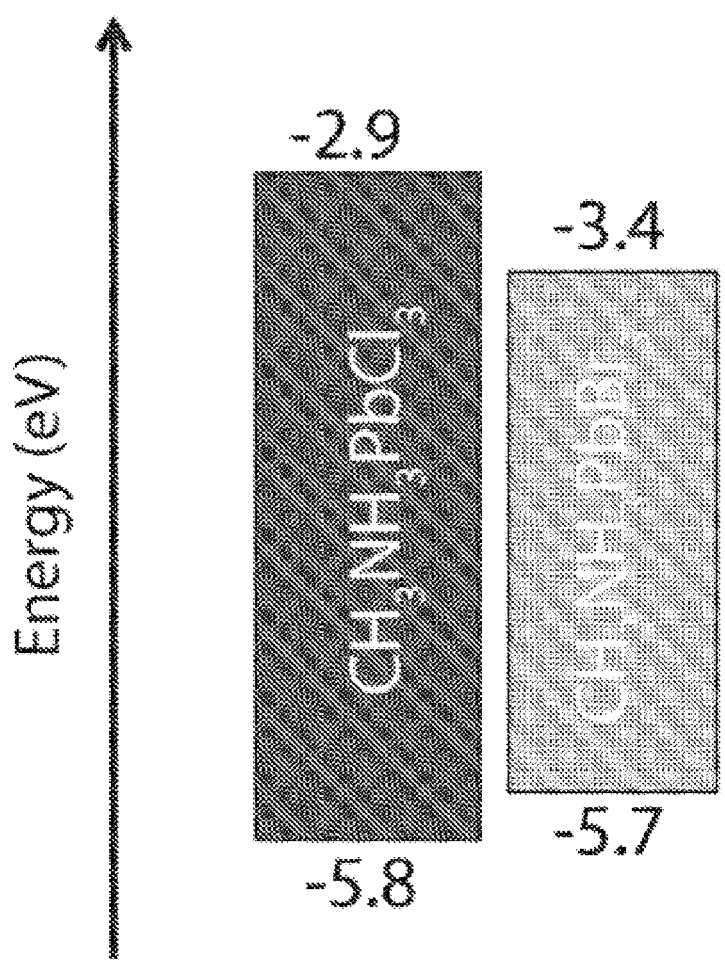
FIG. 3 illustrates the band position for two metal halide perovskite materials.

The band gap and band position tunability of the halide perovskite thin films may be derived from controlling the material structure and composition. As described above, the metal halide perovskite materials have a general chemical structure of $ABX_3$. By changing A, B, and X either independently or simultaneously, a desired band gap or band position may be obtained. FIG. 1 schematically illustrates a typical multilayer thin film LED (organic LED, quantum dot LED, or perovskite LED) device structure 100. An electroluminescent (EL) layer (light emitting layer) 105 may be sandwiched between an electron transport layer (ETL) 110 and a hole transport layer (HTL) 115. The ETL 110 may be further coupled to a cathode 120, and the HTL may be further coupled to an anode 115. FIGS. 2A and 2B illustrates that either or both the ETL 110 and the HTL 115 may comprise metal halide perovskite thin films. In the structure illustrated in FIG. 2A, the ETL 110 and the HTL 115 may have the same or similar band positions, while the ETL 110 and the HTL 115 illustrated in FIG. 2B may have distinctly different band positions. This is further illustrated for two specific metal halide perovskites in FIG. 3. By simply varying the halide in the $ABX_3$ structure, the band position can be varied from a range of −5.8 eV to −2.9 eV for $CH_3NH_3PbCl_3$ to a range of −5.7 eV to −3.4 eV for $CH_3NH_3PbBr_3$.

One of the advantages of the metal halide perovskite thin film materials is that perovskite has a high charge mobility. For instance, $CH_3NH_3SnI_3$ has a hole mobility of 200-300 $cm^2V^{-1}s^{-1}$. Both $CH_3NH_3PbI_3$ and $CH_3NH_3PbBr_3$ have a hole and electron mobility of approximately 100 $cm^2V^{-1}s^{-1}$. The carrier mobility of $CH_3NH_3PbCl_3$ is approximately 50 $cm^2V^{-1}s^{-1}$. The charge mobility of perovskite is higher than organic semiconductors and comparable to traditional inorganic semiconductors. Table 1 lists the mobility values for selected metal halide perovskites.

TABLE 1

Example Mobility Values for Selected Metal Halide Perovskites

| | Mobility, $cm^2V^{-1}s^{-1}$ | |
|---|---|---|
| Materials | Electron | Hole |
| $CH_3NH_3SnI_3$ | | 200-300 |
| $CH_3NH_3PbI_3$ | 100 | 100 |
| $CH_3NH_3PbBr_3$ | 100 | 100 |
| $CH_3NH_3PbCl_3$ | | 50 |

In various embodiments, the use of an organometal halide perovskite-based HTL for highly efficient OLEDs has been demonstrated for the first time. Methylammonium lead chloride $CH_3NH_3PbCl_3$ was chosen in certain embodiments for its optical and electronic properties suitable for application in HTL, i.e. transparency in the visible region due to a wide band gap of about 3.1 eV and high hole conductivity. Although the discussion hereinafter focuses on the use and subsequent results of thin films prepared using methylammonium lead chloride, the present disclosure shall not be considered limited or restricted in any way. One skilled in the art will recognize, in conjunction with the teachings of the present disclosure, that any of the compounds or materials discussed above comprising $ABX_3$ are within the scope of the present disclosure.

By facile spin coating combined with solvent passivation, essentially pure $CH_3NH_3PbCl_3$ thin films may be prepared at low temperature according to various embodiments. The little-to-no solubility of $CH_3NH_3PbCl_3$ thin films in low polarity organic solvents, such as chloroform, chlorobenzene, and toluene, allows for subsequent solution processing of another layer on top to form multilayered structures. Phosphorescent OLEDs based on this solution processed perovskite HTL at a thickness of 25 nm, with a structure of ITO/$CH_3NH_3PbCl_3$/PVK:PBD:TPY$_2$Iracac/BCP/LiF/Al, showed superior device performance with lower turn-on and operation voltage, as well as higher brightness, external quantum efficiency, power efficiency, and luminous efficiency, as compared to a control device based on a standard PEDOT:PSS HTL. The present disclosure represents the first time that organometal halide perovskites have been used as charge transport materials in optoelectronic devices.

Figure 4A:
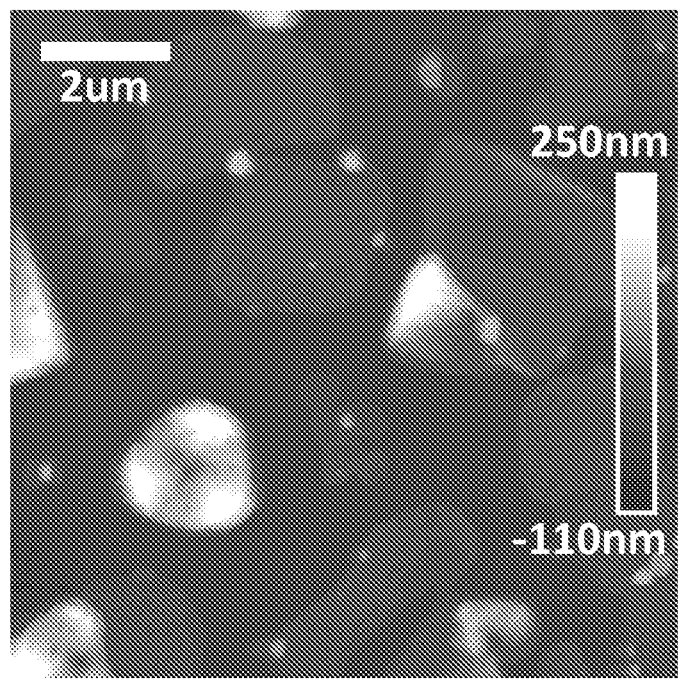
FIG. 4A is a top view of an atomic force microscopy image of $CH_3NH_3PbCl_3$ thin film prepared by simple spin casting without solvent passivation, which consists of large crystals with poor surface coverage and high surface roughness.
Figure 4B:
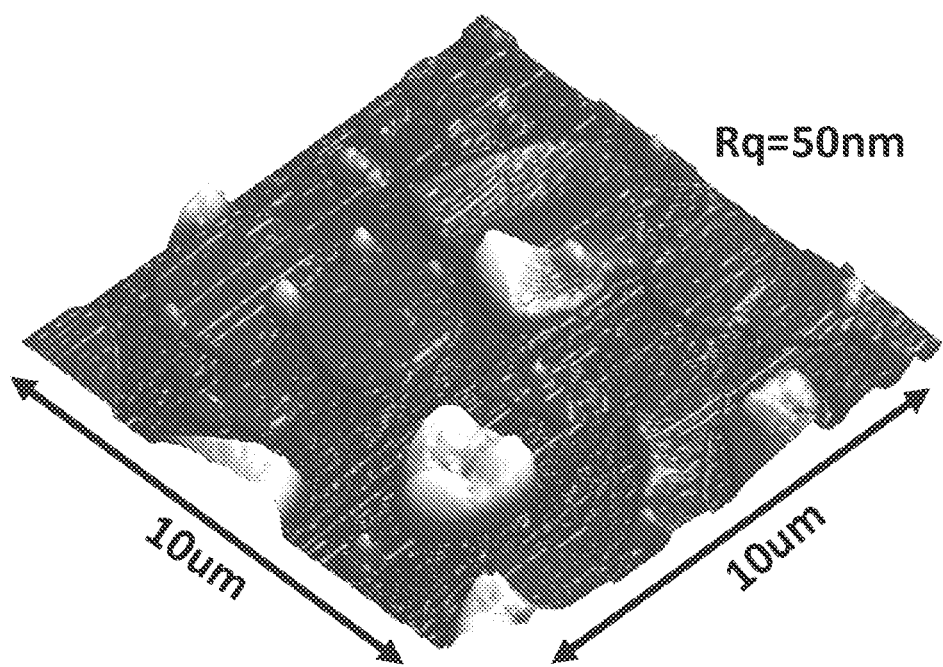
FIG. 4B is 3-D view of the image of FIG. 4A.

$CH_3NH_3PbCl_3$ may be synthesized by reacting $CH_3NH_3Cl$ with $PbCl_2$, in the same way as other methylammonium lead halide perovskites, such as $CH_3NH_3PbI_3$ and $CH_3NH_3Br_3$. However, preparing high quality essentially pure $CH_3NH_3PbCl_3$ thin films via solution processing is not as trivial as for $CH_3NH_3PbI_3$ and $CH_3NH_3bBr_3$, due to the lower solubility of chloride precursors and faster crystallization kinetics. Simple spin coating a dimethylformamide (DMF)/dimethylsulfoxide (DMSO) mixed solution of precursors containing $CH_3NH_3Cl$ and $PbCl_2$ leads to the formation of large $CH_3NH_3PbCl_3$ crystals with poor surface coverage and extremely high roughness, as shown in FIGS. 4A and 4B. The Root Mean Square roughness (Rq) was measured at ~50 nm.

Figure 5:
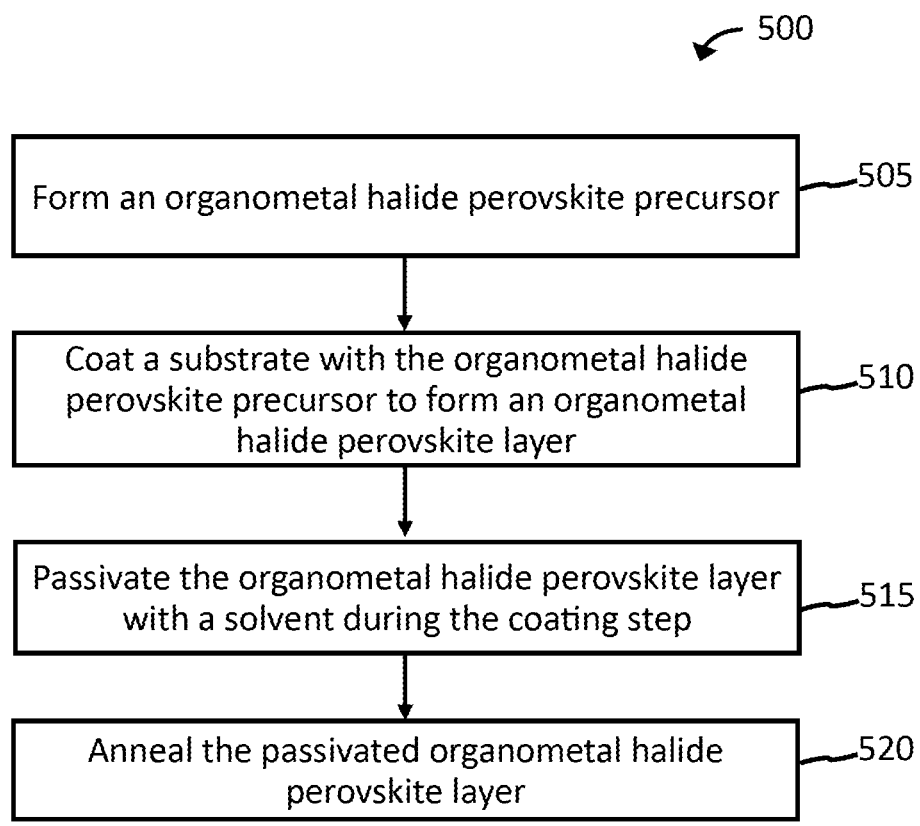
FIG. 5 is a flowchart of an exemplary method for forming a charge transport layer of a thin film optoelectronic device.

FIG. 5 is a flowchart of an exemplary method 500 for forming a charge transport layer of a thin film optoelectronic device. At step 505, an organometal halide perovskite precursor may be formed. A substrate may be coated with the organometal halide perovskite precursor at step 510 to form an organometal halide perovskite layer. At step 515, the organometal halide perovskite layer may be passivated with a solvent during the coating step, and the passivated organometal halide perovskite layer may be annealed at step 520.

Figure 6:
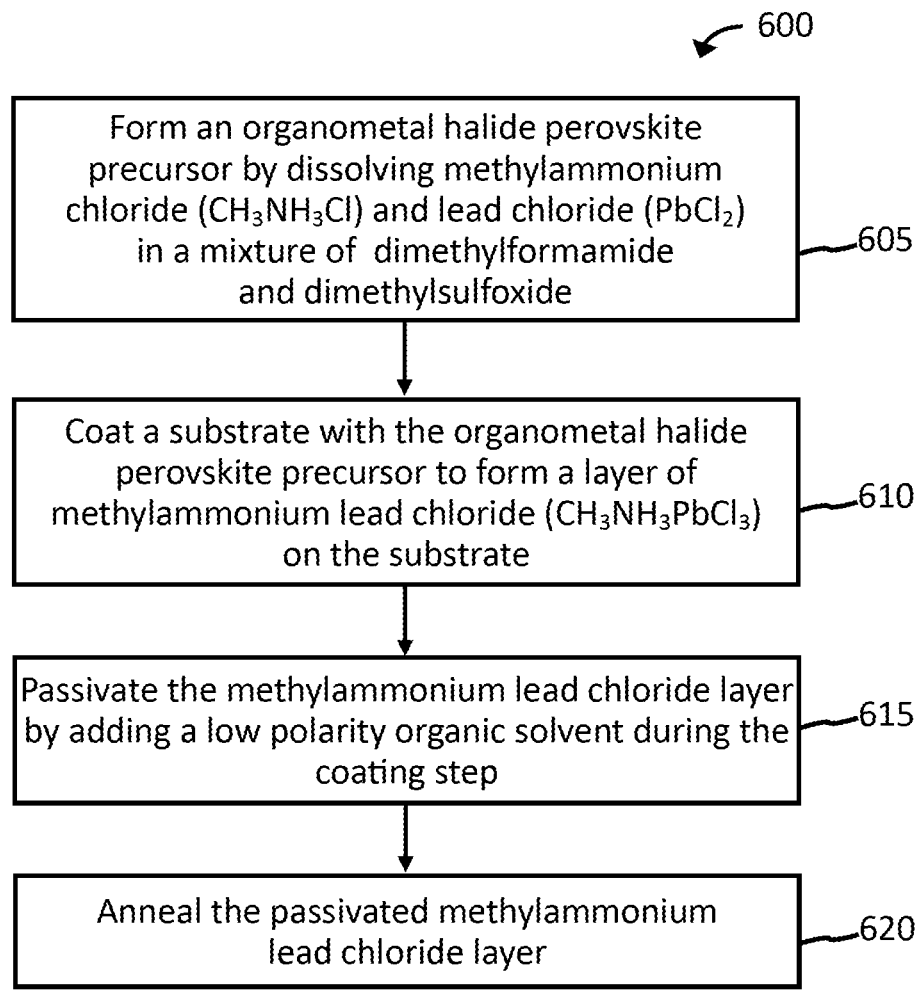
FIG. 6 is a flowchart of an exemplary method for forming a charge transport layer of a thin film optoelectronic device.

FIG. 6 is a flowchart of an exemplary method 600 for forming a charge transport layer of a thin film optoelectronic device. At step 605, an organometal halide perovskite precursor may be formed by dissolving methylammonium chloride ($CH_3NH_3Cl$) and lead chloride ($PbCl_2$) in a mixture of dimethylformamide and dimethylsulfoxide. A substrate may be coated with the organometal halide perovskite precursor at step 610 to form a layer of methylammonium lead chloride ($CH_3NH_3PbCl_3$) on the substrate. At step 615, the methylammonium lead chloride layer may be passivated by adding a low polarity organic solvent during the coating step, and the passivated methylammonium lead chloride layer may be annealed at step 620.

A new type of hole transport layer according to various embodiments based on organometal-halide perovskite for highly efficient LEDs has been demonstrated. The solvent passivation approach allowed for the formation of smooth perovskite thin films with great surface coverage. Solution processed multilayer green phosphorescent LEDs based on this new perovskite HTL showed superior performance over devices using conventional PEDOT:PSS HTL, with lower turn-on (5.2 V vs. 5.9 V) and operating voltages, as well as higher luminescence (2,400 cd/m$^2$ vs. 1,400 cd/m$^2$ at 15 V), higher EQE (7.7% vs. 7.0%), higher power efficiency (7.4 lm/w, vs. 6.6 lm/w), and higher luminous efficiency (29.2 cd/A vs. 26.4 cd/A). The improved device performance was primarily attributed to the wide band gaps, suitable energy levels, and efficient hole injection and transport. Various embodiments demonstrate a new pathway toward highly efficient solution processed multilayer OLEDs, and further establish organic-inorganic halide perovskites as a new class of semiconductors with highly desirable characteristics for thin film optoelectronic devices.

EXAMPLES

Example 1

Figure 7:
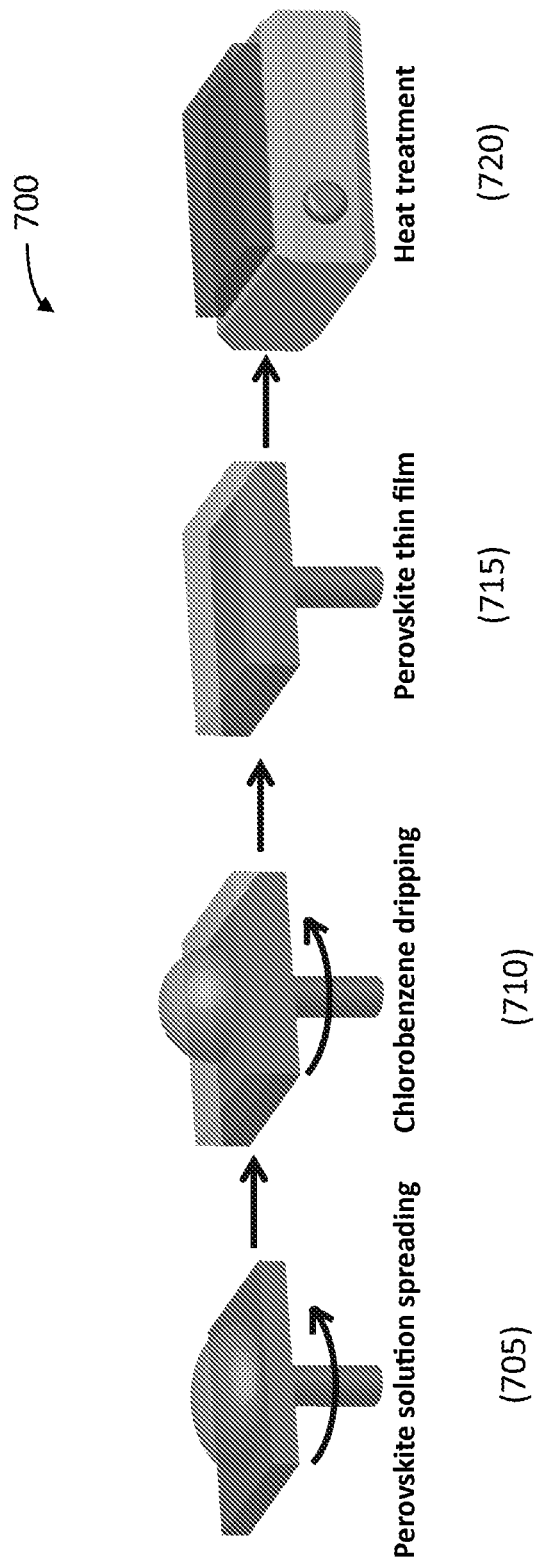
FIG. 7 is a schematic diagram of process for producing $CH_3NH_3PbCl_3$ thin films by spin coating combined with solvent passivation and thermal annealing.
Figure 8A:
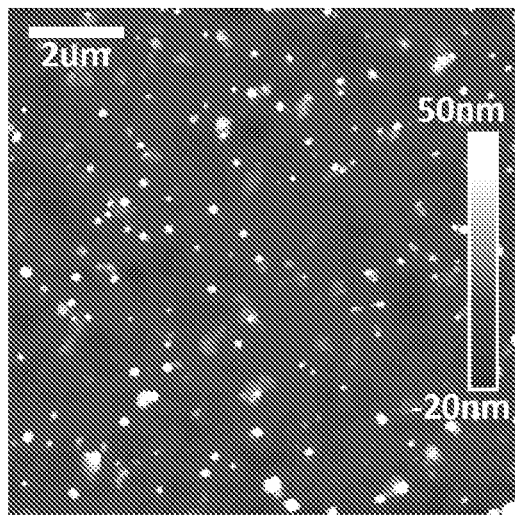
FIG. 8A is a top view of an atomic force microscopy image of $CH_3NH_3PbCl_3$ thin film on a glass substrate.
Figure 8B:
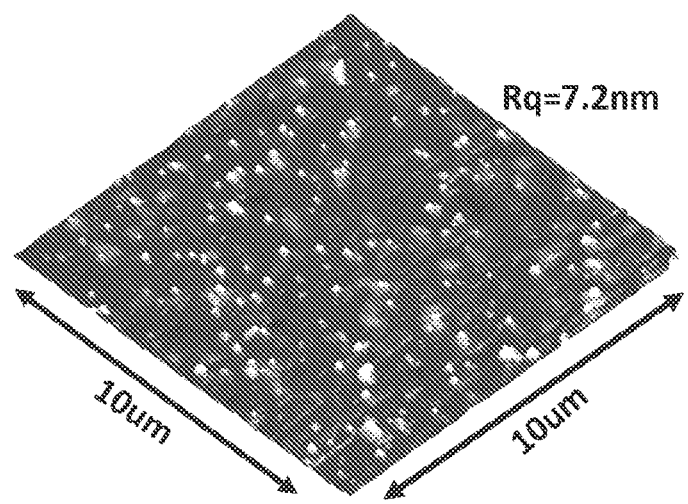
FIG. 8B is a 3-D view of the image of FIG. 8A.
Figure 9:
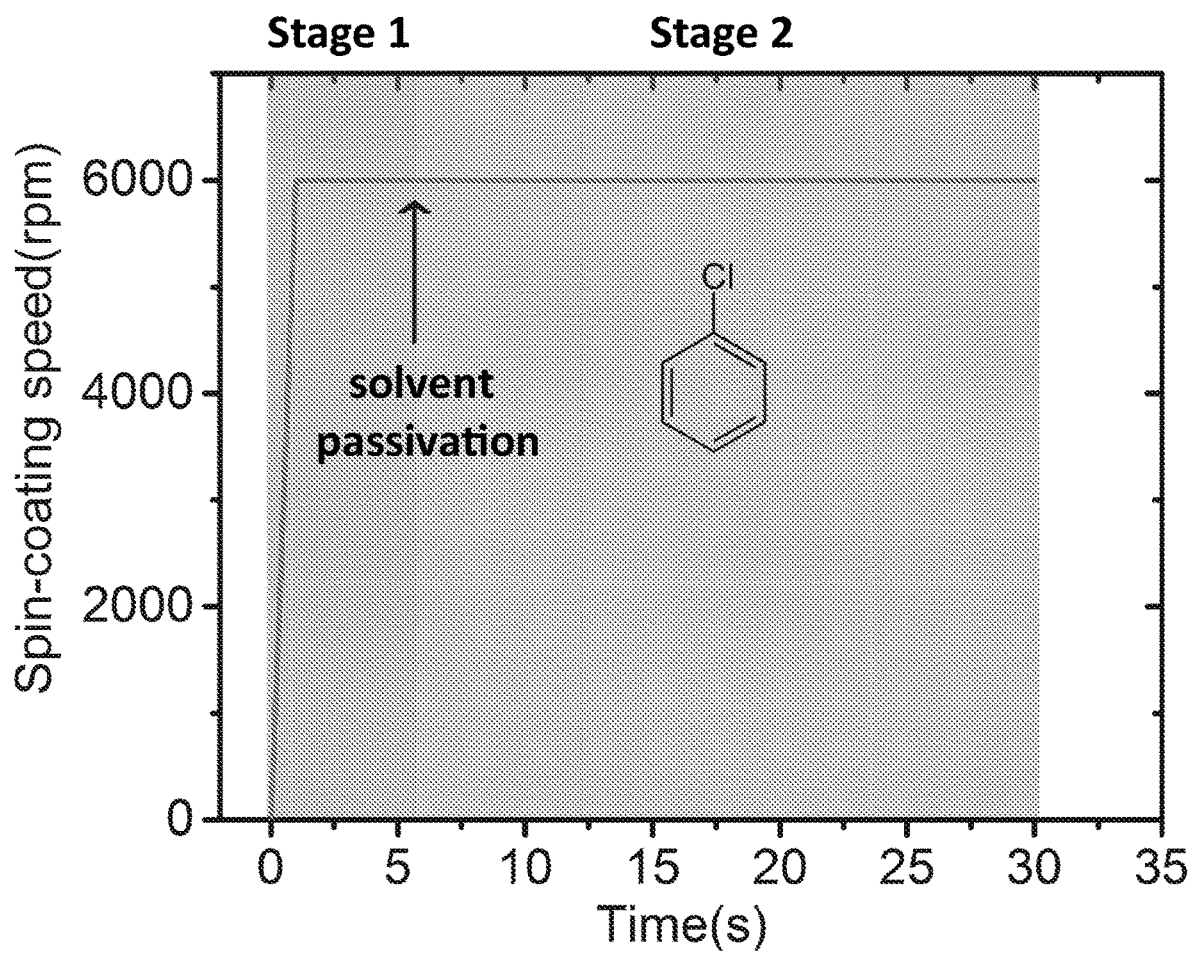
FIG. 9 is a graph illustrating spin coating and chlorobenzene dripping conditions as a solvent passivation method.

To prepare smooth $CH_3NH_3PbCl_3$ thin films with good surface coverage suitable for optoelectronic devices, a solvent passivation approach was used. FIG. 7 and FIG. 9 illustrate the procedure (700 in FIG. 7) for the preparation of essentially pure $CH_3NH_3PbCl_3$ thin films according to various embodiments by spin coating combined with solvent passivation and thermal annealing. The perovskite precursors contained 0.64 M $CH_3NH_3Cl$ and 0.4 M $PbCl_2$ in a solvent mixture of DMF and DMSO (DMF:DMSO, 7:3, V/V). Spin coating (step 705) was carried out at 6,000 rpm for 30 seconds. One ml chlorobenzene was quickly dropped on the thin film at 6 s after the spin coating started (step 710), forming the $CH_3NH_3PbCl_3$ thin film (step 715). After solution processing, thermal annealing was performed at 100° C. for 10 mins to remove the solvent residue and ensure the full conversion of perovskite precursors into $CH_3NH_3PbCl_3$ crystals (step 720). FIG. 8A shows the optical image of the $CH_3NH_3PbCl_3$ thin film of about 25 nm thickness on a glass substrate, which is almost featureless with great transparency. The morphology of this perovskite thin film was characterized by atomic force microscopy (AFM), as shown in FIG. 8A. The 3-D height view is shown in FIG. 8B. Except few randomly scattered nanocrystals standing out, the thin film showed great surface coverage on the glass substrate and good smoothness with a surface roughness of Rq=7.2 nm.

Figure 10:
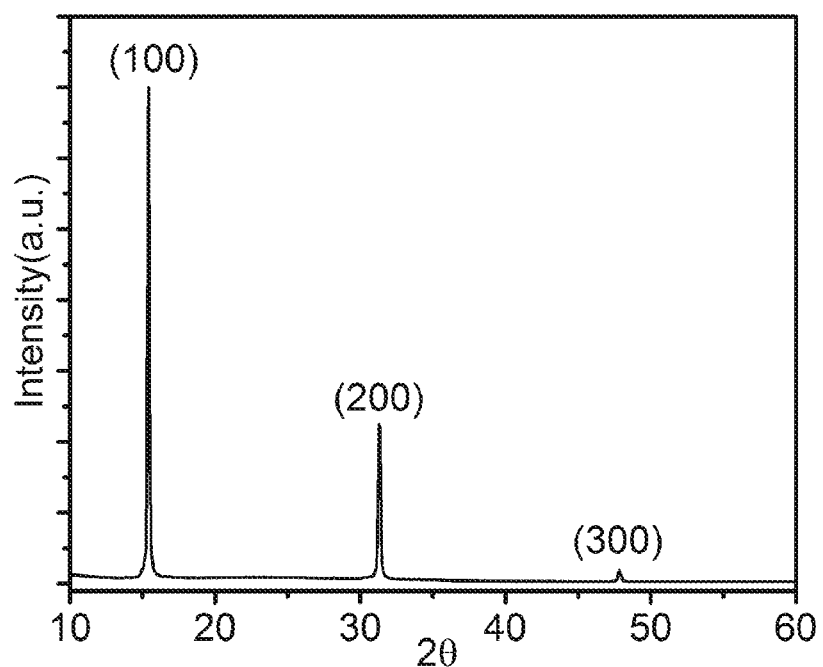
FIG. 10 is an XRD graph of $CH_3NH_3PbCl_3$ thin film of 25 nm on a glass substrate.
Figure 11:
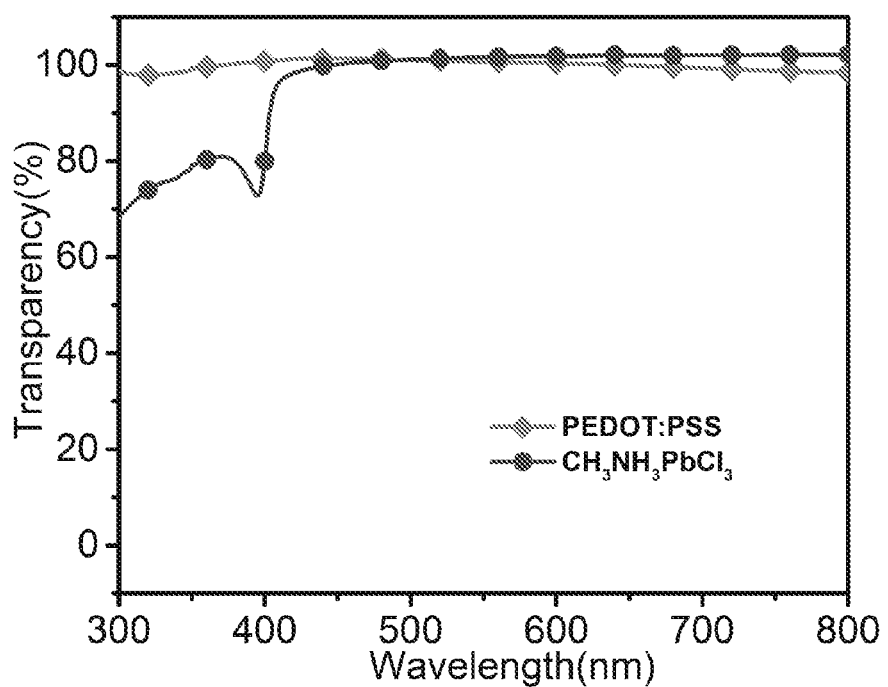
FIG. 11 is a graph of transmittance spectra of $CH_3NH_3PbCl_3$ thin film of 25 nm and PEDOT:PSS of 40 nm.

The formation of highly crystalline and essentially pure $CH_3NH_3PbCl_3$ thin films was confirmed by X-ray diffraction (XRD), as shown in FIG. 10. XRD peaks 15.431°, 31.309°, 47.833° are ascribed to (100), (200) and (300) crystal plane respectively, which are consistent with the cubic structure of $CH_3NH_3PbCl_3$ crystal. FIG. 11 shows the transmittance spectra of the perovskite thin film of 25 nm thick. A sharp peak occurred at around 400 nm, which was attributed to the absorption of $CH_3NH_3PbCl_3$. In the visible region, the perovskite thin film showed extremely high transparency (>95%), which is comparable to that of a 40 nm thick PEDOT:PSS film. This high transparency in the visible region allowed the perovskite thin film to be inserted between the light emitting layer and transparent electrode without affecting the light extraction of emission in the visible region.

Example 2

Figure 12:
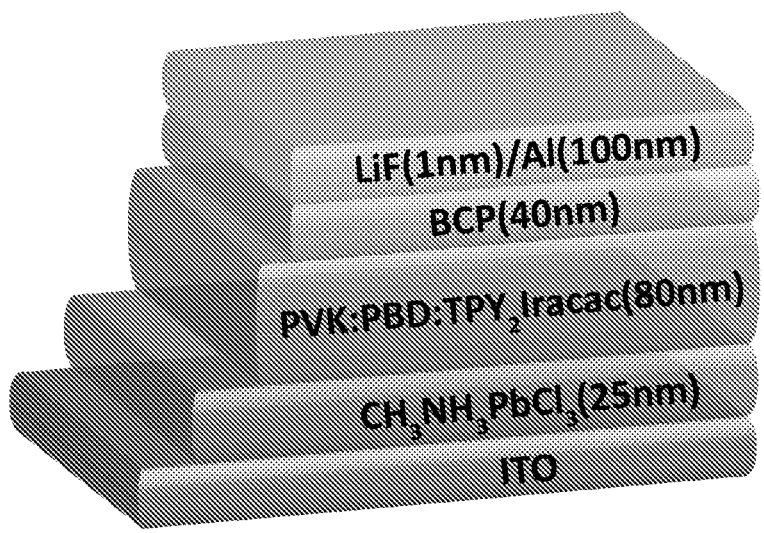
FIG. 12 is a schematic device structure of an OLED with $CH_3NH_3PbCl_3$ thin film HTL.
Figure 13:
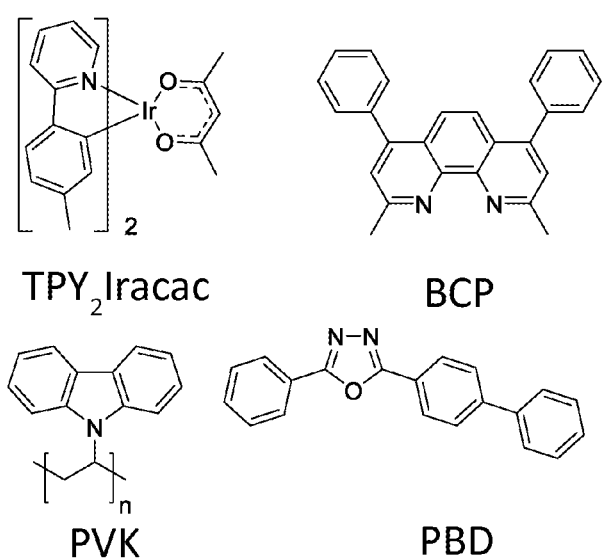
FIG. 13 illustrates chemical structures of organic materials used in OLED devices.
Figure 14:
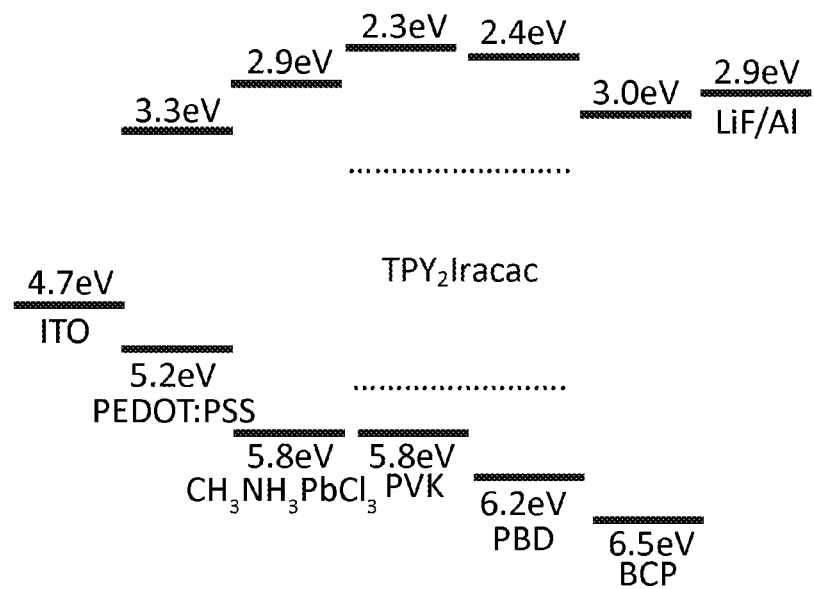
FIG. 14 is an energy level diagram for component materials.
Figure 15:
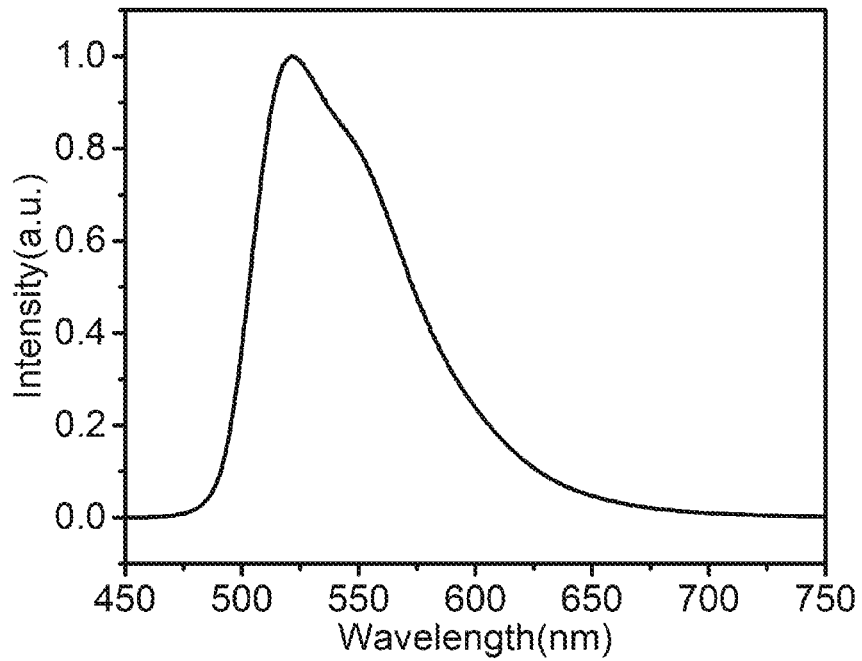
FIG. 15 is a graph of electroluminescence spectrum.

For various embodiments, the performance of $CH_3NH_3PbCl_3$ thin films as HTL in green phosphorescent OLEDs was evaluated. FIG. 12 shows the multilayered device structure, and the materials chemical structures are shown in FIG. 13. A 80 nm thick electroluminescent layer (EL) comprised a guest-host blend with 5 wt % of green phosphorescent emitter TPY$_2$Iracac doped in a PVK:PBD (60/40, w/w) host. A 40 nm thick BCP layer acted as an electron transport and hole/exciton blocking layer. The metal cathode comprised 1 nm LiF and 100 nm Al. Control devices without HTL and with a PEDOT:PSS HTL were also fabricated and tested for comparison. FIG. 14 shows the corresponding energy level diagram for the multilayer structured devices. The Valence Band Maximum (VBM) and Conduction Band Minimum (CBM) energy levels of $CH_3NH_3PbCl_3$ were reported to be 5.82 eV and 2.94 eV, respectively. The deep VBM energy level of $CH_3NH_3PbCl_3$ aligned well with the Highest Occupied Molecular Orbital (HOMO) of PVK, which could enable efficient direct hole injection from the perovskite layer into the PVK:PBD host and/or phosphorescent dopants. FIG. 15 shows the electroluminescent spectrum for all the phosphorescent devices with different HTLs. Pure green emission (peak at 523 nm) from the phosphorescent TPY$_2$Iracac doped into PVK:PBD was observed, suggesting that charge recombination primarily occurred in the emitting layer and there was efficient energy transfer from the PVK:PBD host to the dopant. No emission from the $CH_3NH_3PbCl_3$ layer was observed, which is not surprising considering its wide band gap and efficient energy transfer to the emitting layer.

Example 3

Figure 16:
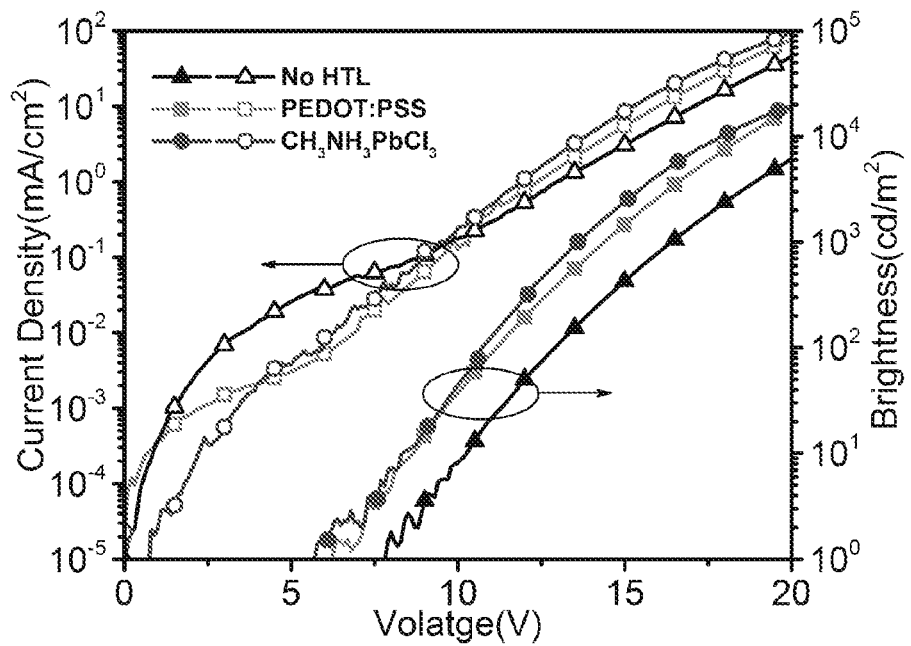
FIG. 16 is a graph of current density versus voltage, and brightness versus voltage for green phosphorescent OLEDs with different HTLs.
Figure 17:
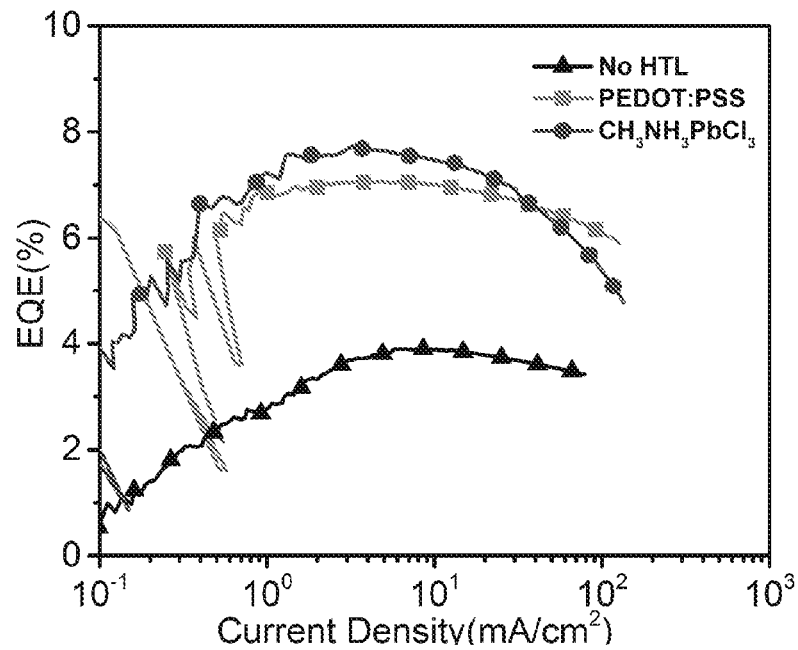
FIG. 17 is a graph of EQE versus current density for green phosphorescent OLEDs with different HTLs.
Figure 18:
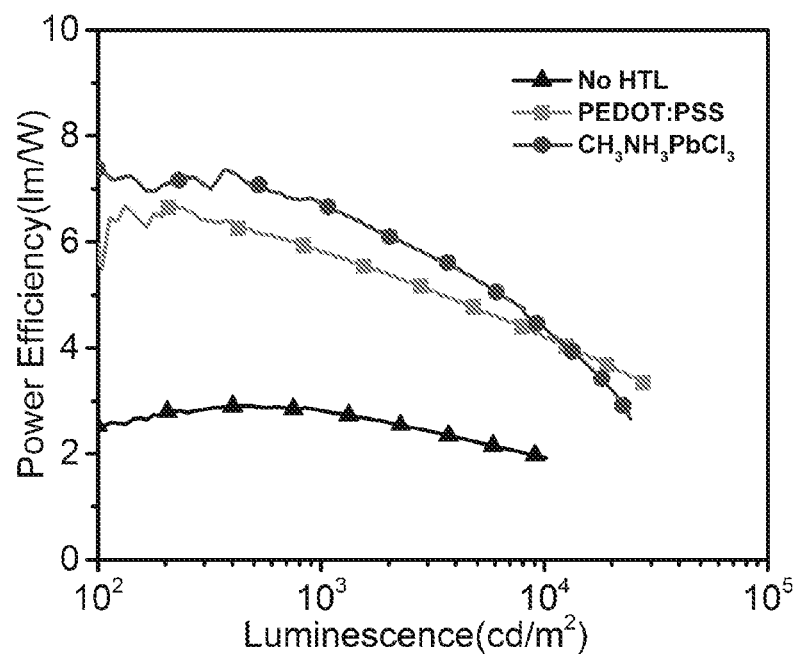
FIG. 18 is a graph of power efficiency versus luminescence for green phosphorescent OLEDs with different HTLs.
Figure 19:
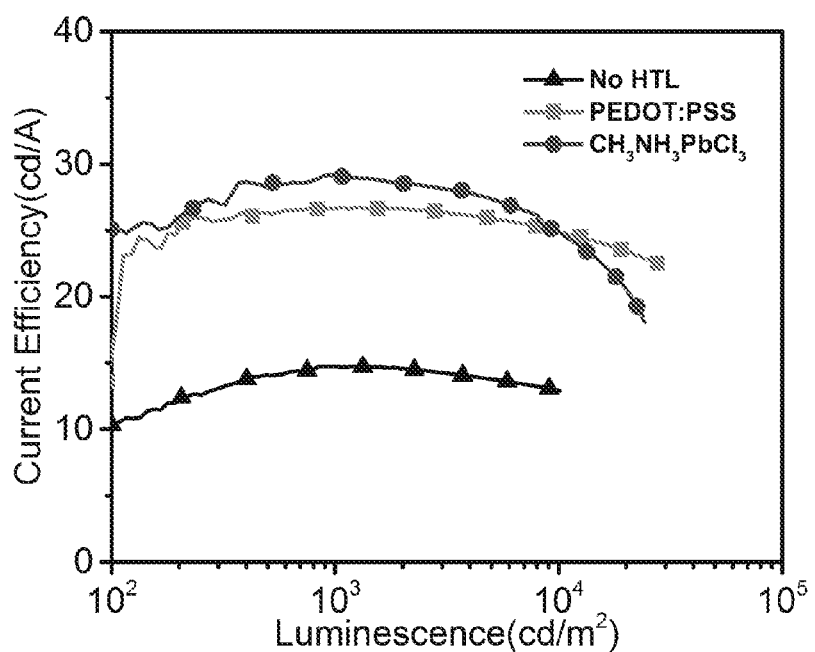
FIG. 19 is a graph of luminous efficiency versus luminescence for green phosphorescent OLEDs with different HTLs.

The device characteristics of OLEDs without HTL, with a PEDOT:PSS HTL, and with a 25 nm $CH_3NH_3PbCl_3$ thin film HTL, are presented in FIGS. 16 through 19 in terms of current density versus voltage (FIG. 16) and brightness versus voltage (FIG. 17). For external quantum efficiencies, power efficiencies are presented in FIG. 18 and luminous efficiencies are presented in FIG. 19. The major device performance values are summarized in Table 2. As shown in FIG. 16, the device with a $CH_3NH_3PbCl_3$ HTL showed much higher current density than the control devices with a PEDOT:PSS HTL and without HTL, indicating the superior charge injection and transport from the ITO anode to the $CH_3NH_3PbCl_3$ layer and light emitting layer. A higher brightness is achieved for the device with a $CH_3NH_3PbCl_3$ HTL over the PEDOT:PSS based device at the same operating voltage, as shown in FIG. 17. The turn-on voltage (@1 cd/m$^2$) of the $CH_3NH_3PbCl_3$ based device is 5.3 V, which is lower than 5.9 V of the PEDOTDT:PSS based device. At 20 V, a maximum brightness of 19,400 cd/m$^2$ is achieved for the $CH_3NH_3PbCl_3$ based device, which is higher than 18,300 cd/m$^2$ for the PEDOT:PSS device. The device with a PEDOT:PSS HTL shows a maximum EQE (7%), maximum power efficiency (6.6 lm/W) and maximum luminous efficiency (26.6 cd/A). These device performance values are comparable to previous results for devices based on PEDOT:PSS with solution processed light emitting layers containing PVK, PBD, and TPY$_2$Iracac. In contrast, the device with a $CH_3NH_3PbCl_3$ HTL shows enhanced maximum EQE (7.7%), maximum power efficiency (7.4 lm/W) and maximum luminous efficiency (29.2 cd/A). As compared to the device without HTL, the $CH_3NH_3PbCl_3$ based OLED shows two fold higher EQE, power efficiency, and luminous efficiency, which clearly confirmed the hole injection/transport functionality of the solution processed $CH_3NH_3PbCl_3$ layer.

TABLE 2

Device Characteristics of OLEDs with Different HTLs

| HTL | No HTL | PEDOT:PSS | $CH_3CH_3PbCl_3$ |
|---|---|---|---|
| Turn-on Voltage (1 cd/m$^2$), V | 7.4 | 5.9 | 5.3 |
| Max. Brightness (@20 V), cd/m$^2$ | 6,100 | 18,300 | 19,400 |
| Max. EQE, % | 3.8 | 7.0 | 7.7 |
| Max. Power Efficiency, lm/W | 2.9 | 6.6 | 7.4 |
| Max. Luminous Efficiency, cd/A | 14.7 | 26.6 | 29.2 |

Example 4

Figure 20:
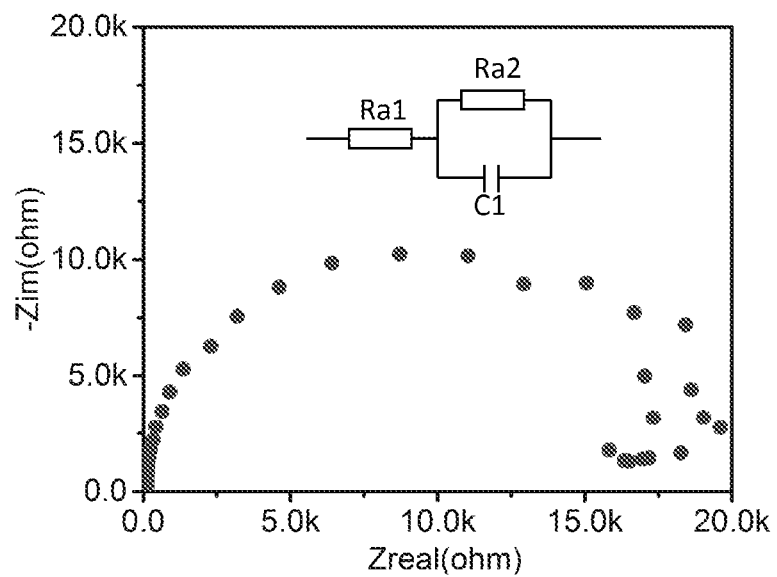
FIG. 20 is a graph of impedance spectroscopy Cole-Cole plots of $CH_3NH_3PbCl_3$ based OLED.
Figure 21:
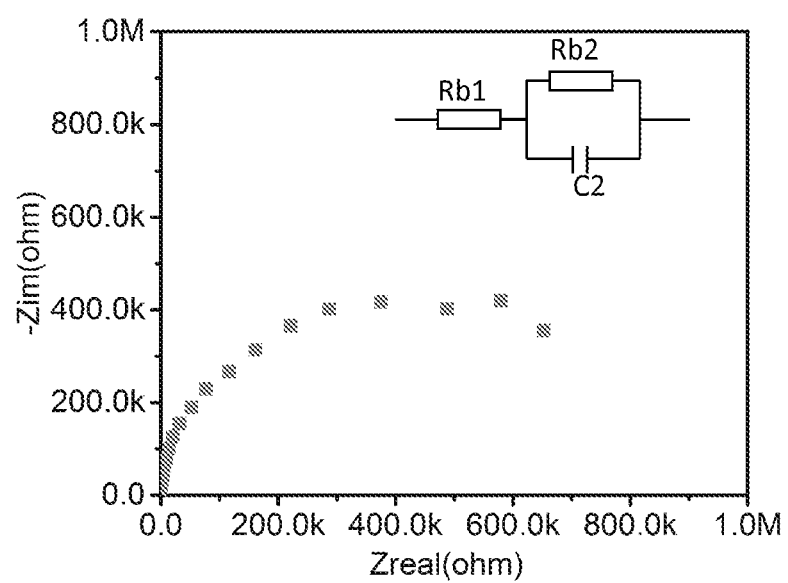
FIG. 21 is a graph of impedance spectroscopy Cole-Cole plots of PEDOT:PSS based OLED.
Figure 22:
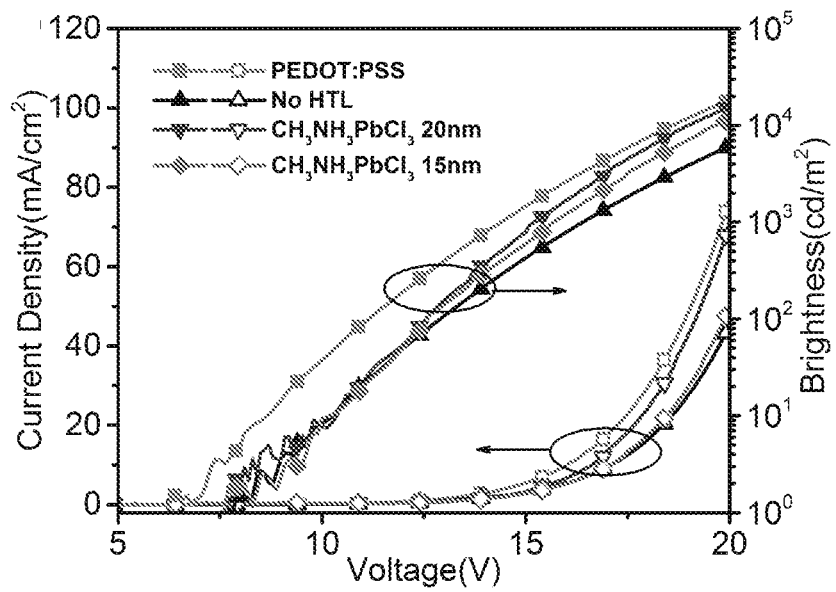
FIG. 22 is a graph of current density versus voltage, and brightness versus voltage for green phosphorescent OLEDs with 20 nm and 15 nm thickness $CH_3NH_3PbCl_3$.
Figure 23:
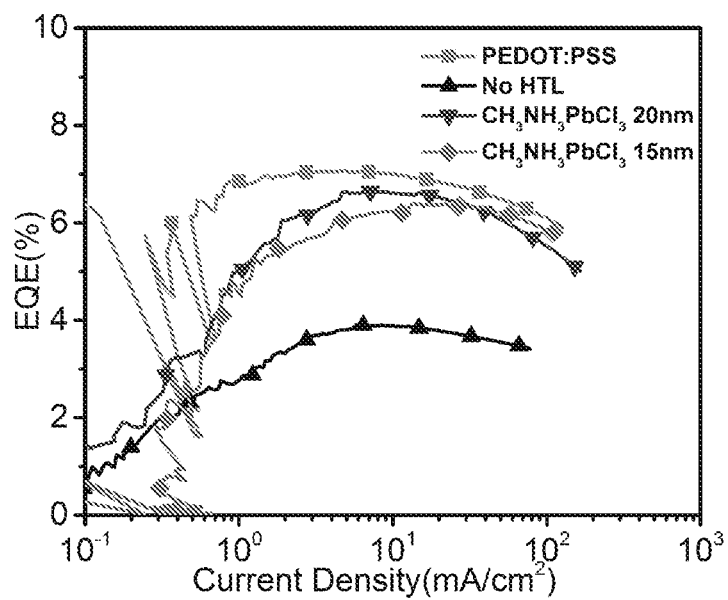
FIG. 23 is a graph of EQE versus current density for green phosphorescent OLEDs with 20 nm and 15 nm thickness $CH_3NH_3PbCl_3$.
Figure 24:
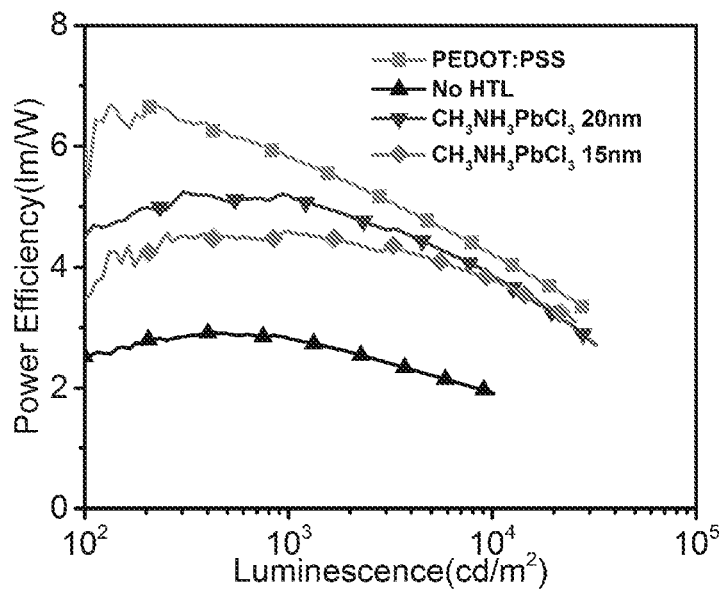
FIG. 24 is a graph of power efficiency versus luminescence for green phosphorescent OLEDs with 20 nm and 15 nm thickness $CH_3NH_3PbCl_3$.
Figure 25:
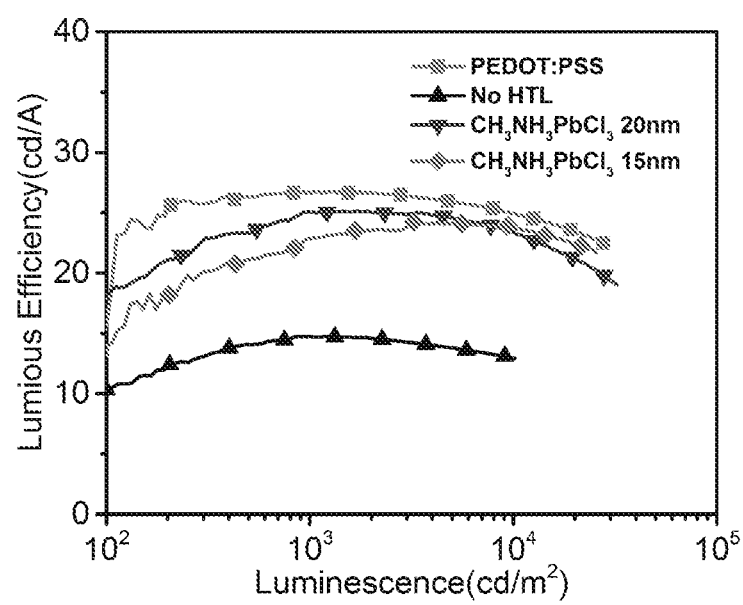
FIG. 25 is a graph of luminous efficiency versus luminescence for green phosphorescent OLEDs with 20 nm and 15 nm thickness $CH_3NH_3PbCl_3$.
Figure 26A:
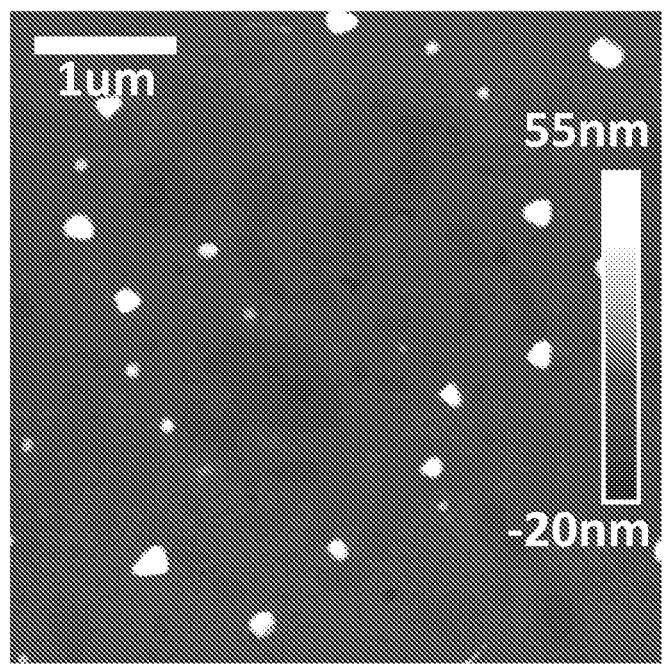
FIG. 26A is a top view of an atomic force microscopy image of $CH_3NH_3PbCl_3$ thin films at 20 nm.
Figure 26B:
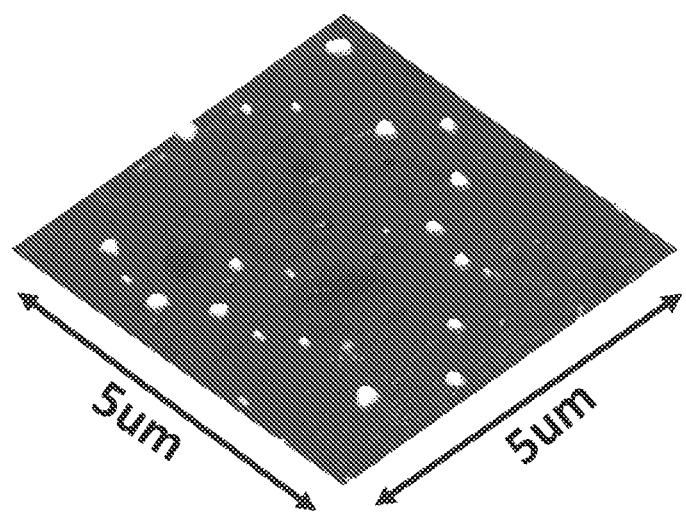
FIG. 26B is a 3-D view of the image of FIG. 26A.
Figure 27A:
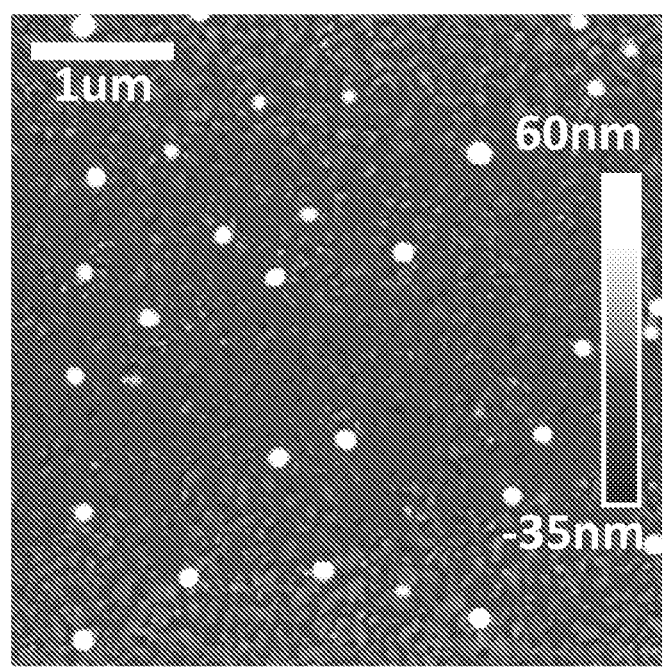
FIG. 27A is a top view of an atomic force microscopy image of $CH_3NH_3PbCl_3$ thin films at 15 nm.
Figure 27B:
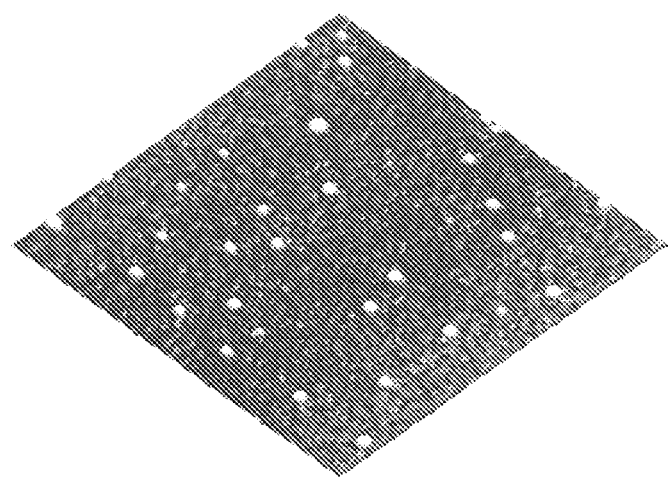
FIG. 27B is a 3-D view of the image of FIG. 27A.

To further confirm the enhanced hole injection and transport with the introduction of a $CH_3NH_3PbCl_3$ layer, impedance spectroscopy measurements were performed on the fabricated devices. Much lower impedance is observed for the device with a $CH_3NH_3PbCl_3$ HTL as shown in FIG. 20 than the control device with a PEDOT:PSS HTL as shown in FIG. 21, suggesting the reduction of a barrier for the hole injection, consistent with the lowered driving voltage for the device. OLEDs with $CH_3NH_3PbCl_3$ HTLs at different thicknesses of 20 nm and 15 nm have also been fabricated, which showed slightly lower device performance in FIGS. 22 through 25 as compared to the results presented in FIGS. 16 through 19. This could be attributed to the inferior thin film morphology and surface coverage as shown in the AFM images of FIGS. 26A and 26B (20 nm) and FIGS. 27A and 27B (15 nm), which could lead to less efficient hole injection and transport.

Experimental

Materials and Equipment.

PEDOT:PSS (Clevios™ P VP AI 4083) was purchased from Heraeus. $CH_3NH_3Cl$, $PbCl_2$, PVK, PBD, BCP, LiF, and Al were purchased from Sigma-Aldrich and used as received. TPY$_2$Iracac was synthesized in-house according to the report procedure. Pre-patterned ITO-coated glass substrates (20 Ω/sq) were purchased from the Thin Film Devices Inc.

Thin film optical absorption and transparency were measured in a CARY 5000 UV-Vis-NIR spectrophotometer. The thickness of thin films was determined by a Dektak 150 profilometer. Atomic force microscopy (AFM) images were taken with a Bruker Icon scanning probe microscope in tapping-mode.

X-Ray Diffraction was performed using a custom built Huber 4-circle diffractometer with graphite monochromator and analyzer in non-dispersive diffraction geometry, coupled to a Rigaku rotating anode generator producing CuKα radiation.

Preparations of Perovskite Thin Films.

$CH_3NH_3Cl$ and $PbCl_2$ were dissolved in DMF:DMSO mixed solutions (DMF:DMSO,7/3,V/V) at concentrations of 0.64 M and 0.4 M respectively. The $CH_3NH_3PbCl_3$ precursor solution was prepared by mixing the $CH_3NH_3Cl$ and $PbCl_2$ solutions by 1 to 1 volume ratio. DMSO was used to enhance the solubility of $CH_3NH_3PbCl_3$. The mixed solution passed though a syringe filter before it was spin cast on substrates at 6,000 rpm for 30 s. One ml chlorobenzene was quickly dropped at 6 s during spin coating. Thermal annealing was performed right after spin casting at 100° C. for 10 mins to remove the solvent residue and fully convert the precursors into $CH_3NH_3PbCl_3$ thin films. $CH_3NH_3PbCl_3$ thin films at 20 nm and 10 nm thick were also prepared by using the same method with 0.4 M $CH_3NH_3Cl$+0.25 M $PbCl_2$, and 0.24 M $CH_3NH_3Cl$+0.15 M $PbCl_2$, respectively.

Phosphorescent OLEDs Fabrication and Testing.

ITO-coated glass substrates were cleaned by successive sonication in soap solution, deionized water, acetone, and isopropanol for 15 min at 40° C. and UV ozone cleaned for 20 min. For the device with PEDOT:PSS as HTL, PEDOT:PSS was spun-cast onto the cleaned ITO coated glass substrate at a spin speed of 3,000 rpm for 45 s and baked at 140° C. for 20 mins to obtain a 40 nm thick thin film. For the devices with $CH_3NH_3PbCl_3$ based HTLs, the films were prepared by the method mentioned above. After the deposition of HTL, a solution of 13 mg/mL PVK:PBD (60/40 w/w) containing 5 wt % of TPY$_2$Iracac in chloroform was spin coated on the top at 4,000 rpm for 30 s. The thickness was about 80 nm. A 40 nm thick layer of BCP was then deposited at a rate of 1.0 Å/s under high vacuum conditions (<3×10$^{-6}$ Torr). After the deposition of BCP, the chamber was vented, and a shadow mask with a 2 mm wide stripe was placed onto the substrates perpendicular to the ITO stripes. 1 nm LiF and 100 nm Al were deposited at a rate of 0.02 Å/s and 4 Å/s, respectively. OLEDs were formed at the 2×2 mm squares where the ITO (anode) and Al (cathode) stripes intersect.

The devices were tested in air within 30 mins after fabrication. The electrical and optical intensity characteristics of the devices were measured with a Keithly 4200 sourcemeter/multimeter coupled to a FDS 1010 Si photodiode (Thor Labs). Only light emitted from the front face of the device was collected and used in subsequent efficiency calculations. The electroluminescence (EL) spectra were measured on a HORIBA iHR320 spectrofluorimeter, equipped with a HORIBA Synapse CCD detection system. The emission was found to be uniform throughout the area of each device.

Impedance Spectroscopy Study.

The Impedance Spectroscopy measurements were performed on the fabricated devices using a Gamry Interface 1000. DC voltage was fixed at 8 V. For the AC voltage, the amplitude of the test signal was 100 mV. The range of measurement frequency was set from 100 Hz to 1 MHz. From the Cole-Cole plot in FIGS. 15 and 16, the bulk resistance Rb2 of the PEDOT:PSS based device was determined at about 827×10$^3$ ohm. As compared to the control device, the bulk resistance Ra2 of $CH_3NH_3PbCl_3$ based device dramatically decreased to $18\times10^3$ ohm, which proved that the $CH_3NH_3PbCl_3$ based device had a much higher conductivity and lower driving voltage. The results were consistent with the higher current density in $CH_3NH_3PbCl_3$ based device than PEDOT:PSS device.

The advantages set forth above, and those made apparent from the foregoing description, are efficiently attained. Since certain changes may be made in the above construction without departing from the scope of the present disclosure, it is intended that all matters contained in the foregoing description or shown in the accompanying drawings shall be interpreted as illustrative and not in a limiting sense.

It is also to be understood that the following claims are intended to cover all of the generic and specific features of the present disclosure herein described, and all statements of the scope of the present disclosure that, as a matter of language, might be said to fall therebetween.

Glossary of Claim Terms

Anneal: A process, typically thermal, used to further a chemical reaction and evaporate volatile components.

Charge transport layer: A layer, such as a hole transporting layer or an electron transporting layer, in an optoelectronic device that allows for the movement of electrons within the device in response to an electric current of exposure to a light source.

Light emitting: A device or material that emits visible light when subjected to an electric current.

Light harvesting: A device or material that absorbs energy from radiant light and produces an electrical current.

Low polarity organic solvent: an organic (carbon based) solvent with a relatively low dielectric constants (ranging from about 5 to 20).

Organometal halide: A compound containing at least one bond between a carbon atom of an organic compound and a metal and that also contains a halide ion.

Passivate: A chemical modification of a surface.

Perovskite: A class of compounds with the same type of crystal structure as calcium titanium oxide ($CaTiO_3$) with the oxygen in the face centers.

Photoactive layer: The layer of an optoelectronic device that absorbs or emits light.

Thin film optoelectronic device: An optoelectronic device utilizing one or more layers of material ranging in thickness from fractions of a nanometer to several micrometers.

We claim:

1. An optoelectronic device comprising:
a first charge transport layer;
a photoactive layer; and
a second charge transport layer;
wherein the photoactive layer is arranged between the first charge transport layer and the second charge transport layer; and
wherein the first charge transport layer, the second charge transport layer, or both the first charge transport layer and the second charge transport layer comprises a halide perovskite film, the halide perovskite film comprising a halide perovskite of formula—$ABX_3$,
wherein A is a cation, B is a metal, and X is a halide, and
wherein the photoactive layer does not comprise the halide perovskite of formula $ABX_3$.

2. The device of claim 1, wherein the halide perovskite film is transparent (>95%).

3. The device of claim 1, wherein the halide perovskite film is a solvent passivated halide perovskite film.

4. The device of claim 1, wherein the halide perovskite film is an annealed solvent passivated halide perovskite film.

5. The device of claim 1, wherein A is an organic cation.

6. The device of claim 5, wherein A is selected from the group consisting of methylammonium ($CH_3NH_3$) and formamidinium ($NH_2CHNH_2$).

7. The device of claim 1, wherein A is an inorganic cation.

8. The device of claim 7, wherein A is cesium (Cs).

9. The device of claim 1, wherein B is selected from the group consisting of lead (Pb), tin (Sn), and germanium (Ge).

10. The device of claim 1, wherein the halide perovskite is selected from the group consisting of $CH_3NH_3PbCl_3$, $CH_3NH_3PbBr_3$, $CH_3NH_3SnI_3$, and $CH_3NH_3PbI_3$.

11. The device of claim 1, wherein the halide perovskite film is a halide perovskite thin film.

12. The device of claim 1, wherein the first charge transport layer is an electron transporting layer.

13. The device of claim 1, wherein the second charge transport layer is a hole transporting layer.

14. The device of claim 1, wherein the photoactive layer comprises a light emitting layer.

15. The device of claim 1, wherein the photoactive layer comprises a light harvesting layer.

16. An optoelectronic device comprising:
a first charge transport layer comprising methylammonium lead chloride ($CH_3NH_3PbCl_3$);
a photoactive layer, wherein the photoactive layer does not comprise a halide perovskite of formula $ABX_3$, wherein A is a cation, B is a metal, and X is a halide; and
a second charge transport layer;
wherein the photoactive layer is arranged between the first charge transport layer and the second charge transport layer.

17. The device of claim 16, wherein the first charge transport layer is transparent (>95%).

18. The device of claim 16, wherein the first charge transport layer is an electron transporting layer.

19. The device of claim 16, wherein the first charge transport layer is a hole transporting layer.

20. The device of claim 16, wherein the photoactive layer is a light emitting layer.

* * * * *